(12) United States Patent
Fujimoto et al.

(10) Patent No.: US 7,511,498 B2
(45) Date of Patent: Mar. 31, 2009

(54) MAGNETIC RESONANCE IMAGING APPARATUS AND RF COIL

(75) Inventors: Masahiro Fujimoto, Tokyo (JP); Masaru Yoshida, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 54 days.

(21) Appl. No.: 11/565,892

(22) Filed: Dec. 1, 2006

(65) Prior Publication Data

US 2007/0229073 A1 Oct. 4, 2007

(30) Foreign Application Priority Data

Mar. 28, 2006 (JP) .............. 2006-087981

(51) Int. Cl. *G01V 3/00* (2006.01)
(52) U.S. Cl. ................ 324/318; 324/322
(58) Field of Classification Search ........... 324/318, 324/322
See application file for complete search history.

(56) References Cited

U.S. PATENT DOCUMENTS

| | | | | |
|---|---|---|---|---|
| 5,202,634 A | * | 4/1993 | Potthast et al. | 324/322 |
| 5,221,901 A | * | 6/1993 | Decke et al. | 324/318 |
| 5,898,306 A | * | 4/1999 | Liu et al. | 324/322 |
| 6,043,658 A | * | 3/2000 | Leussler | 324/318 |
| 6,169,401 B1 | * | 1/2001 | Fujita et al. | 324/318 |
| 6,297,636 B1 | * | 10/2001 | Shimo et al. | 324/318 |
| 6,404,199 B1 | * | 6/2002 | Fujita et al. | 324/318 |
| 6,487,436 B1 | * | 11/2002 | Boskamp et al. | 600/422 |
| 6,940,282 B2 | * | 9/2005 | Dumoulin et al. | 324/318 |
| 2006/0061360 A1 | * | 3/2006 | Leussler et al. | 324/318 |

FOREIGN PATENT DOCUMENTS

| JP | 2003250776 A | 9/2003 |
|---|---|---|
| JP | 2003290168 A | 10/2003 |

* cited by examiner

*Primary Examiner*—Brij B Shrivastav
*Assistant Examiner*—Megann E Vaughn
(74) *Attorney, Agent, or Firm*—GE Global Patent Operation; Roger C. Phillips

(57) ABSTRACT

A magnetic resonance imaging apparatus capable of receiving magnetic resonance signals with a plurality of coils while uniformly exciting such signals is to be provided. An RF coil of the magnetic resonance imaging apparatus is provided with an original loop unit, and a conductor which is so connected to the original loop unit as to split the original loop unit into split loop units. A control unit applies a high frequency magnetic field with the original loop unit and receives magnetic resonance signals with the split loop units.

10 Claims, 4 Drawing Sheets

MAGNETIC RESONANCE IMAGING APPARATUS AND RF COIL

BACKGROUND OF THE INVENTION

The present invention relates to a magnetic resonance imaging apparatus, an RF coil and a method of controlling the magnetic resonance imaging apparatus.

For magnetic resonance imaging apparatuses, there is known a method by which magnetic resonance signals are excited with a plurality of coils such as phased array coils, and the excited magnetic resonance signals are received to create images by an image synthesizing method such as the sum-of-squares method or the SENSE method (see, for instance, JP-A No. 250776/2003). There is also known a method by which one loop of an RF coil is split into a plurality of sub-loops, and the size of the RF coil is made changeable by receiving magnetic resonance signals with the loop before splitting or one of the sub-loops resulting from the splitting (see, for instance, JP-A No. 290168/2003).

Where transmission and reception are performed with a plurality of coils, unevenness in transmission results from differences in sensitivity distribution or efficiency among the coils. On the other hand, where transmission and reception are performed with a single coil, unevenness in transmission can be restrained, but no such technique as the SENSE method can be used.

SUMMARY OF THE INVENTION

Therefore, an object of the present invention is to provide a magnetic resonance imaging apparatus capable of receiving magnetic resonance signals with a plurality of coil while uniformly exciting such signals, an RF coil and a method of controlling the magnetic resonance imaging apparatus.

A magnetic resonance imaging apparatus according to a first aspect of the invention is provided with a magnetostatic field forming unit which forms a magnetostatic field; a gradient magnetic field forming unit which forms a gradient magnetic field; an RF coil which applies a high frequency magnetic field in a subject within the magnetostatic field and receives magnetic resonance signals from the subject; an RF drive unit which outputs drive signals for applying the high frequency magnetic field to the RF coil; a data collecting unit which collects data based on the magnetic resonance signals received by the RF coil; an image forming unit which forms tomographic images of the subject on the basis of the data collected by the data collecting unit; and control means which controls the operation of the RF coil, wherein the RF coil is provided with an original loop unit; a conductor which is so connected to the original loop unit as to split the original loop unit into a plurality of split loop units; and switching means which makes the conductor either conductive or non-conductive, and wherein the control means so controls the operation of the switching means as to apply the high frequency magnetic field by way of the original loop unit and receive the magnetic resonance signals generated by the application by way of the split loop units.

It is preferable that the RF drive unit is connected to any one of the plurality of split loop units, and the data collecting unit is connected to each of the plurality of split loop units.

It is preferable that there are further provided a first switch which selectively makes conductive one split loop unit out of the plurality of split loop units and either one of the RF drive unit and the data collecting unit, and a second switch which makes conductive or non-conductive another split loop unit out of the plurality of split loop units and the data collecting unit, wherein the control unit so controls the first switch and the second switch as to make conductive the one split loop unit and the RF drive unit and make non-conductive the other split loop unit and the data collecting unit when the high frequency magnetic field is applied, or make conductive the one split loop unit and the data collecting unit and make conductive the other split loop unit and the data collecting unit when the magnetic resonance signals are received.

It is preferable that the original loop unit is so arranged, as viewed in a prescribed direction orthogonal to a prescribed axis of the subject, as to be opposite to a prescribed region of the subject, which is asymmetric with respect to the prescribed axis, in the prescribed direction.

It is preferable that the conductor is provided with an electrostatic capacitance element connected in series; and the electrostatic capacitance of the electrostatic capacitance element is so set as not to allow the plurality of split loop units to interfere with each other when the conductor is made conductive by the switching means.

It is preferable that the switching means is configured of a parallel oscillation circuit comprising a switching electrostatic capacitance element connected in series to the conductor; an inductance element connected in parallel to the switching electrostatic capacitance element, and a diode connected in series to the inductance element.

It is preferable that the image forming means generates by the SENSE method an image based on the magnetic resonance signals received by the plurality of split loop units.

An RF coil of a magnetic resonance imaging apparatus according to a second aspect of the invention is provided with an original loop unit; a conductor which is so connected to the original loop unit as to split the original loop unit into a plurality of split loop units; and switching means which switches over the state of the RF coil between a transmitting state in which the conductor is made non-conductive and a resonance circuit whose resonance frequency is a prescribed operation frequency is formed of the original loop unit and a receiving state in which the conductor is made conductive and a resonance circuit whose resonance frequency is the operation frequency is formed of the plurality of split loop units.

An RF coil of a magnetic resonance imaging apparatus according to a third aspect of the invention is provided with an original loop unit; and a conductor which is so connected to the original loop unit as to split the original loop unit into a plurality of split loop units; wherein any one of the plurality of split loop units is connected to an RF drive unit, and each of the plurality of split loop units is connected to a data collecting unit which collects data based on received magnetic resonance signals.

It is preferable that the split loop unit to which the RF drive unit is connected is connected to the RF drive unit and the data collecting unit via a first switch which selectively makes conductive any of the split loop unit and the RF drive unit or the data collecting unit, and the other split loop unit is connected to the data collecting unit via a second switch which makes conductive or non-conductive that other split loop unit and the data collecting unit.

A magnetic resonance imaging apparatus according to a fourth aspect of the invention is provided with an original loop unit; a conductor which is so connected to the original loop unit as to split the original loop unit into a plurality of split loop units; an electrostatic capacitance element connected in series to the conductor; and switching means which makes the conductor conductive or non-conductive, wherein the electrostatic capacitance of the electrostatic capacitance element is so set as not to allow the plurality of split loop units to interfere with each other when the conductor is made conductive by the switching means; and each of the plurality of split loop units is connected to a data collecting unit which collects data based on received magnetic resonance signals.

A control method for a magnetic resonance imaging apparatus according to a fifth aspect of the invention is intended for a magnetic resonance imaging apparatus by which magnetic resonance signals are received by applying a high frequency magnetic field to an imaging space in which a magnetostatic field and a gradient magnetic field are formed, by an RF coil equipped with an original loop unit and a conductor which is so connected to the original loop unit as to split the original loop unit into a plurality of split loop units, to form an image in accordance with the magnetic resonance signals, the method comprising the steps of: applying the high frequency magnetic field with the original loop unit by making the conductor non-conductive; and receiving the magnetic resonance signals with each of the plurality of split loop units by making the conductor conductive.

According to the invention, it is possible to receive magnetic resonance signals with a plurality of coils while uniformly exciting the signals. Further objects and advantages of the present invention will be apparent from the following description of the preferred embodiments of the invention as illustrated in the accompanying drawings.

DETAILED DESCRIPTION OF THE INVENTION

Figure 1:
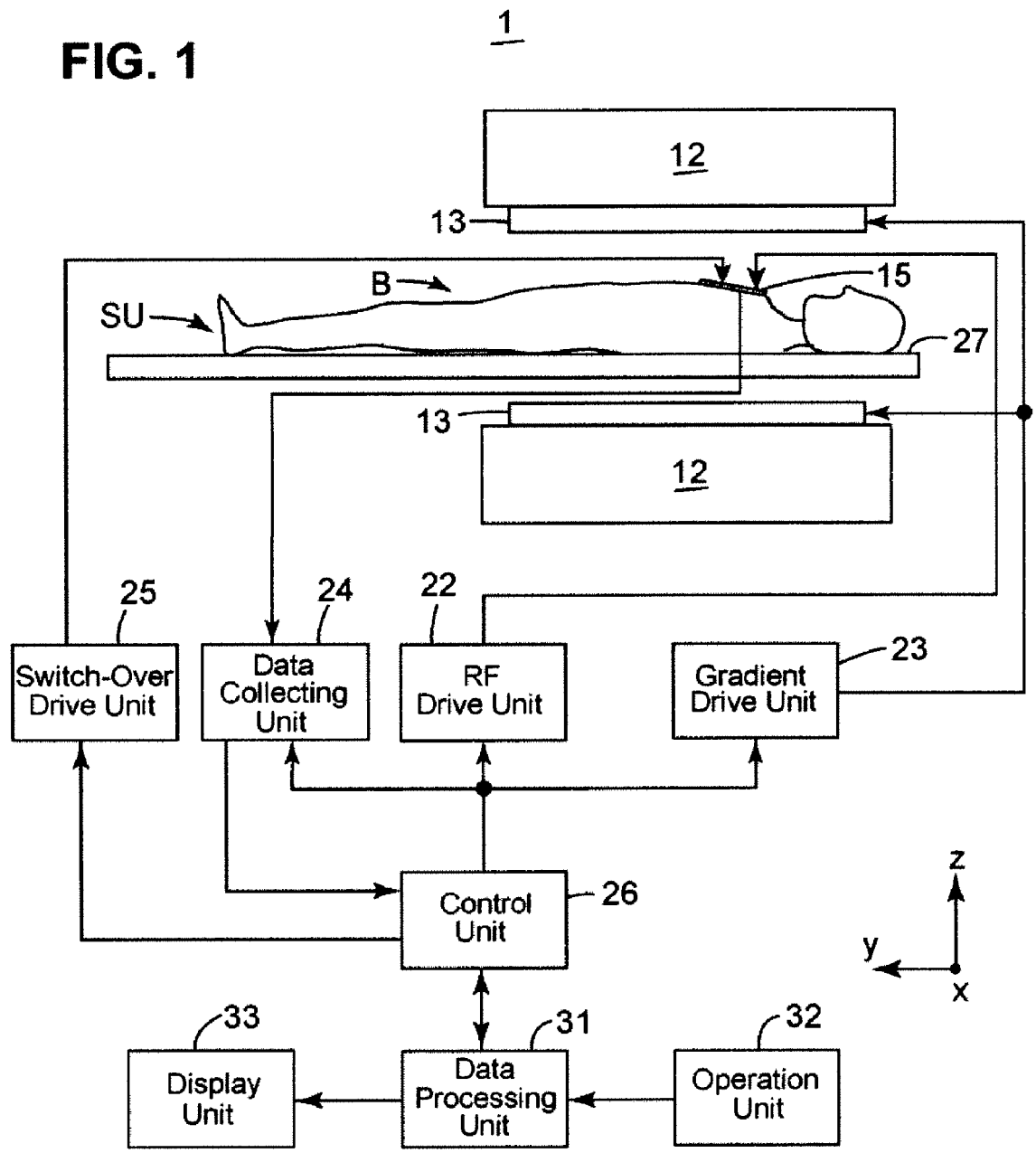
FIG. 1 is a block diagram showing the configuration of a magnetic resonance imaging apparatus in the first mode for carrying out the present invention.

Exemplary Mode for Implementation 1 FIG. 1 is a block diagram showing a schematic configuration of a magnetic resonance imaging apparatus (MRI) 1 in this mode for implementation. The magnetic resonance imaging apparatus has a magnetostatic magnet unit 12, a gradient coil 13, an RF coil 15, an the RF drive unit 22, a gradient drive unit 23, a data collecting unit 24, a switch-over drive unit 25, a control unit 26, a cradle 27, a data processing unit 31, an operation unit 32 and a display unit 33.

The magnetostatic magnet unit 12 is intended for forming a magnetostatic field in a imaging space B in which a subject is accommodated. The magnetostatic magnet unit 12 is configured of a pair of permanent magnets. And the magnetostatic magnet unit 12 is so configured that the direction of the magnetostatic field is along the direction of the body axis of the subject SU or a direction normal to the body axis. Incidentally, the magnetostatic magnet unit 12 may as well be configured of superconducting magnets.

The gradient coil 13 forms a gradient magnetic field in the imaging space B in which a magnetostatic field is formed, and adds positional information to magnetic resonance signals received by the RF coil 15. The gradient coil 13 has three lines including a first gradient coil for forming a frequency encoding gradient magnetic field, a second gradient coil for forming a phase encoding gradient magnetic field, and a third gradient coil for forming a slice selecting gradient magnetic field.

The RF coil 15 forms a high frequency magnetic field by transmitting an RF pulse, which is an electromagnetic wave, to the subject in the imaging space B in which a magnetostatic field is formed by the magnetostatic magnet unit 12, and excites the spinning of protons in the imaging area of the subject SU. Further, the RF coil 15 receives and outputs an electromagnetic wave generated from the excited protons in the subject SU as magnetic resonance signals. The RF coil 15 is configured of, for instance, a surface coil to be arranged on the body surface of the subject SU.

The RF drive unit 22 drives the RF coil 15 to output to the RF coil 15 a drive signal for forming a high frequency magnetic field in the imaging space B. More specifically, it has a gate modulator (not shown), an RF power amplifier (not shown) and an RF oscillator (not shown). The RF drive unit 22 converts, in accordance with a control signal from the control unit 26, the RF signal from the RF oscillator into a signal of a prescribed timing and a prescribed envelope by using the gate modulator. And, it outputs to the RF coil 15 the RF signal modulated by the gate modulator after amplifying it with the RF power amplifier.

The gradient drive unit 23 drives, in accordance with a control signal from the control unit 26, the gradient coil 13 by applying a gradient pulse to it to generate a gradient magnetic field in the imaging space B in which a magnetostatic field is formed. The gradient drive unit 23 has three lines of drive circuits (not shown) matching the three lines of gradient coils.

The data collecting unit 24 collects, in accordance with a control signal from the control unit 26, collects magnetic resonance signals received by the RF coil 15 and outputs them to the data processing unit 31. The data collecting unit 24 so collects the magnetic resonance signals having undergone phase encoding and frequency encoding as to match k spaces. In the data collecting unit 24, after a phase detector subjects the magnetic resonance signals received by the RF coil 15 to phase detection with the output of the RF oscillator of the RF drive unit 22 as a reference signal, an A/D converter converts the magnetic resonance signals, which are analog signals, into digital signals. And the collected magnetic resonance signals, after they are stored into a memory, are outputted to the data processing unit 31.

The switch-over drive unit 25 controls the operation of a switch-over unit for carrying size alteration of the RF coil 15 to be described afterwards. More specifically, in accordance with a control signal from the control unit 26, it applies to the switch-over unit a bias voltage in the forward direction or the backward direction.

The control unit 26 has a computer and a program to cause the computer to so execute the functions of various units to match a prescribed pulse sequence. And the control unit 26 performs control by outputting, in accordance with an operation signal inputted from the operation unit 32 via the data processing unit 31, control signals to cause each of the RF drive unit 22, the gradient drive unit 23 and the data collecting unit 24 to execute a prescribed pulse sequence.

The cradle 27 is a table on which the subject SU is to be mounted. The cradle 27 moves, in accordance with a control signal from the control unit 26, between the inside and the outside of the imaging space B.

The data processing unit 31 has a computer and a program to cause the computer to execute prescribed data processing. The data processing unit 31 is connected to the operation unit 32, and operation signals from the operation unit 32 are inputted to it. And the data processing unit 31, connected to the control unit 26, outputs to the control unit 26 the operation signals inputted by the operator the operation unit 32. The data processing unit 31, also connected to the data collecting unit 24, acquires magnetic resonance signals collected by the data collecting unit 24, and subjects the acquired magnetic resonance signals to image processing to generate an image regarding a slice of the subject. And the data processing unit 31 outputs the generated image to the display unit 33. Incidentally, the data processing unit 31 functions as an image generating unit.

The operation unit 32 is configured of an operating device, such as a keyboard or a mouse. The operation unit 32 is operated by an operator, and outputs to the data processing unit 31 operation signals according to his or her operation.

The display unit 33 is configured of a display device, such as a CRT. The display unit 33 displays an image regarding a slice of the subject generated on the basis of magnetic resonance signals the subject SU.

Figure 2:
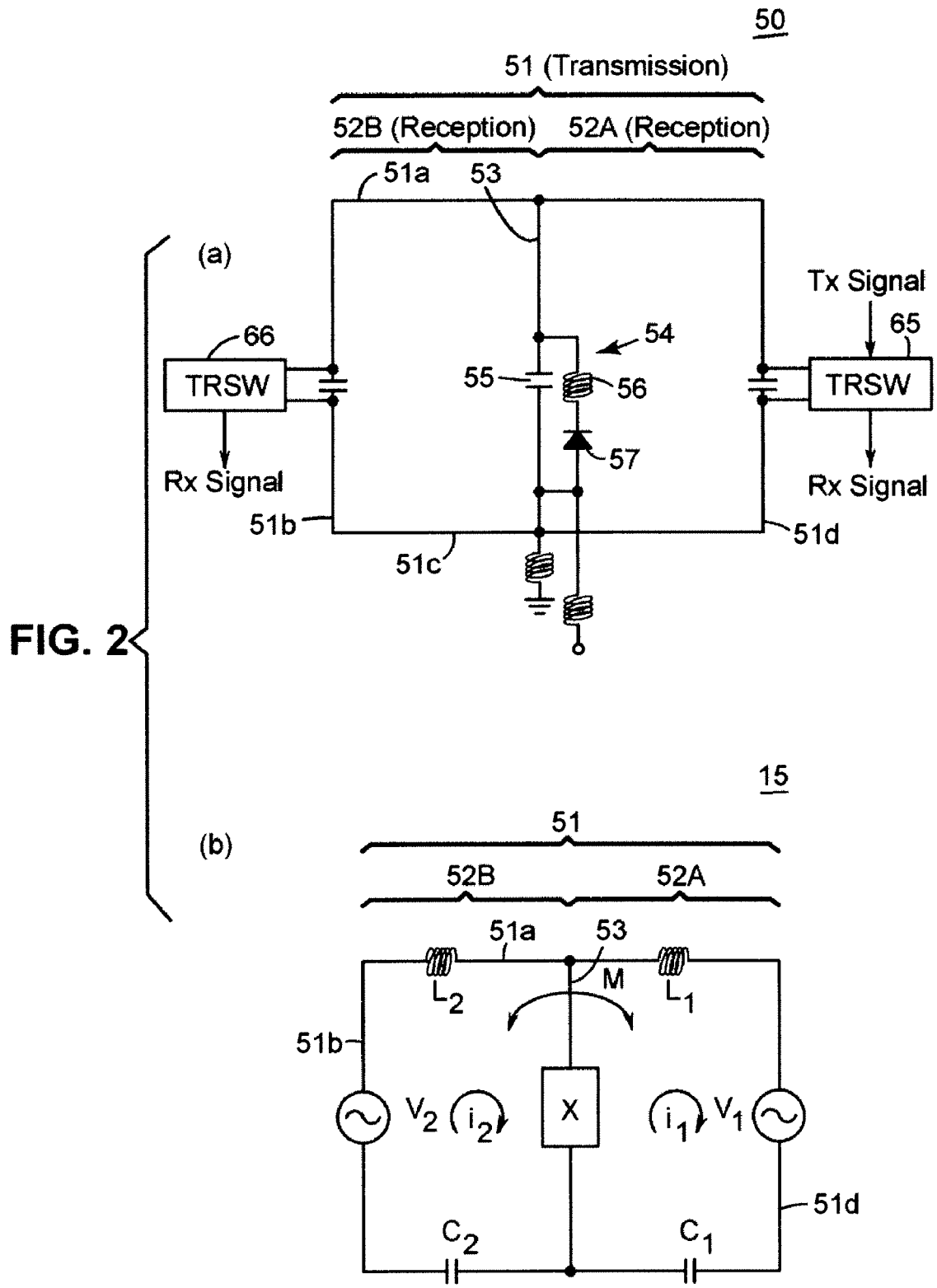
FIG. 2 are partially abridged circuit diagrams showing the configuration of the transmission coil of the magnetic resonance imaging apparatus of FIG. 1.

FIG. 2(a) is a circuit diagram showing the configuration of the RF coil 15. Some elements including the inductor are dispensed with in the illustration, though.

The RF coil 15 is provided with an original loop unit 51 and a conductor 53 connected to the original loop unit 51 so that the original loop unit 51 can be split into two split loop units 52A and 52B. A switch-over unit 54 for switching over the conductance state is also connected to the conductor 53, and he RF coil 15 is so configured that the loop unit it uses can be selected out of the original loop unit 51 and the split loop units 52A and 52B by the switch-over unit 54 as it switches over the conductance state.

The original loop unit 51 is formed, for instance, in a substantially rectangular shape, and is provided with four linear elements 51a through 51d. The original loop 51 may be set in a circular or some other appropriate shape. A capacitor, inductor and the like are appropriately connected in series to the original loop 51 so as to configure a resonance circuit whose resonance frequency is a prescribed operation frequency.

The split loop units 52A and 52B are formed as a result of the connection of the conductor 53 to the mutually opposing elements 51a and 51c of the original loop unit 51 and the splitting of the original loop unit 51, each containing part of the elements of the original loop unit and the conductor 53. The conductor 53 is shared by the split loop units 52A and 52B.

The split loop unit 52A is connected to the RF drive unit 22 and the data collecting unit 24 via a TR switch 65. The TR switch 65 selectively makes the split loop unit 52A conductive to either the RF drive unit 22 or the data collecting unit 24. The TR switch 65 is so configured, for instance, as to include a switch which makes the split loop unit 52A and the RF drive unit 22 conductive or non-conductive and a switch which makes the split loop unit 52A and the data collecting unit 24 conductive or non-conductive, and each switch is so configured as to include a parallel resonance circuit, a FET and the like. The operation of the TR switch 65 is controlled by the control unit 26.

The split loop unit 52B is connected to the data collecting unit 24 via a TR switch 66. The TR switch 66 selectively makes the split loop unit 52B and the data collecting unit 24 conductive or non-conductive. The TR switch 66 is so configured, for instance, as to include a parallel oscillation circuit, a FET and the like. Incidentally, the TR switch 66 may as well be of the same configuration as the TR switch 65. The operation of the TR switch 66 is controlled by the control unit 26.

The conductor 53 is formed of the same material and in the same sectional shape as, for instance, the elements 51a through 51d of the original loop unit 51. The conductor 53 also is formed in a linear shape, for instance, from the elements 51a through 51c, and shapes the split loop units 52A and 52B substantially in rectangles. The conductor 53 is provided with a capacitor or an inductor as required so as to cause the split loop units 52A and 52B to configure a resonance circuit whose resonance frequency is a prescribed operation frequency.

The switch-over unit 54, configured of a parallel oscillation circuit whose resonance frequency is the operation frequency of the RF coil 15 for instance, is provided with a capacitor 55 connected in series to the conductor 53, an inductor 58 connected in parallel to the capacitor 55, and a diode 57 connected in series to the inductor 58. The switch-over drive unit 25 is connected to the anode or the cathode of the diode 57, and the application of a bias in the forward direction or the backward direction causes the switch-over unit 54 to make the conductor 53 conductive or non-conductive.

Incidentally, FIG. 2(a) shows by way of example a case in which the diode 57 is so connected that the switch-over unit 54 functions as a parallel oscillation circuit and places the conductor 53 in a non-conductive state when a bias in the forward direction is applied to the diode 57 or the switch-over unit 54 becomes equivalent to the capacitor 55 and places the conductor 53 in a conductive state when a bias in the backward direction is applied to the diode 57.

In the RF coil 15 described above, when the conductor 53 is made non-conductive by the switch-over unit 54, the original loop unit 51 constitutes a resonance circuit whose resonance frequency is the operation frequency, or when the conductor 53 becomes conductive, the split loop units 52A and 52B constitute a resonance circuit whose resonance frequency is the operation frequency. And the static capacitance on the conductor 53 is so set that, when the split loop units 52A and 52B constitute a resonance circuit, the split loop unit 52A and the split loop unit 52B may not interfere with each other. A more specific description follows.

FIG. 2(b) is a circuit diagram showing an equivalent circuit to the RF coil 15. Capacitors C1 and C2, and inductors L1 and L2 respectively represent capacitors and inductors equivalent to all the capacitors and inductors on the elements 51a through 51d of the split loop units 52A and 52B, and an element X represents an element equivalent to every element having an impedance on the conductor 53. The mutual inductance of the split loop units 52A and 52B is represented by M. Supposing that voltages $V_1$ and $V_2$ and applied and currents $i_1$ and $i_2$ flow to the split loop units 52A and 52B, respectively, the following equations will hold.

$$V_1 = X_{C1}i_1 + X_{L1}i_1 + X_{i1} - X_{i2} - X_{Mi2}$$

$$V_2 = X_{C2}i_2 + X_{L2}i_2 + X_{i2} - X_{i1} - X_{Mi1}$$

where $X_{c1}$, $X_{c2}$, $X_{L1}$, $X_{L2}$, X and $X_M$ are the respective impedances of the capacitors C1 and C2, the inductors L1 and L2, the element X and the mutual inductance M. To rearrange the foregoing equations:

$$V_1 = (X_{C1} + X_{L1} + X)i_1 - (X + XM)i_2$$

$$V_2 = (X + X_M)i_1 + (X_{C2} + X_{L2} + X)i_2$$

If the split loop units 52A and 52B are isolated from each other, in other words if they are mutually unaffected by the other's current, the term of crosstalk will be 0, and therefore:

$$-(X + X_M)i_2 = 0$$

$$-(X + X_M)i_1 = 0$$

and $$X + X_M = 0$$

Therefore, the following will hold:

$$X = -X_M = -j\omega M = 1/(j(1/(\omega M)))$$

As this represents a static capacitance, X=Cm being supposed.

$$\omega Cm = 1/(\omega M)$$

$$\therefore Cm = 1/(\omega^2 M)$$

Incidentally, ω is the operation frequency of the RF coil 15.

Therefore, if the static capacitance of the capacitors on the conductor 53 is so that as to make the static capacitance Cm resulting from the synthesis of the static capacitance on the conductor 53 to $1/(\omega^2 M)$, interference between the split loop units 52A and 52B will be restrained when the conductor 53 is made conductive and magnetic resonance signals are received with the split loop unit 52A. Incidentally, the capacitors on the conductor 53 include, for instance, the capacitor 55 contained in the switch-over unit 54. Also, a capacitor may be provided on the conductor 53 separately from the switch-over unit 54.

Incidentally, the static capacitance Cm on the conductor 53 is so set as to equalize the resonance frequency (operation frequency) of the original loop unit 51 and the resonance frequency (operation frequency) of the split loop units 52A and 52B.

$$\omega = 1/(L_{12} \times C_{12})^{1/2}$$

$$= 1/(L_{1m} \times C_{1m})^{1/2}$$

$$= 1/(L_{2m} \times C_{2m})^{1/2}$$

Here, $L_{12}$ and $C_{12}$ are the inductance and the static capacitance of the whole the original loop unit 51, $L_{1m}$ and $C_{1m}$, inductance and the static capacitance of the whole split loop unit 52A, and $L_{2m}$ and $C_{2m}$, the inductance and the static capacitance of the whole split loop unit 52B.

Figure 3:
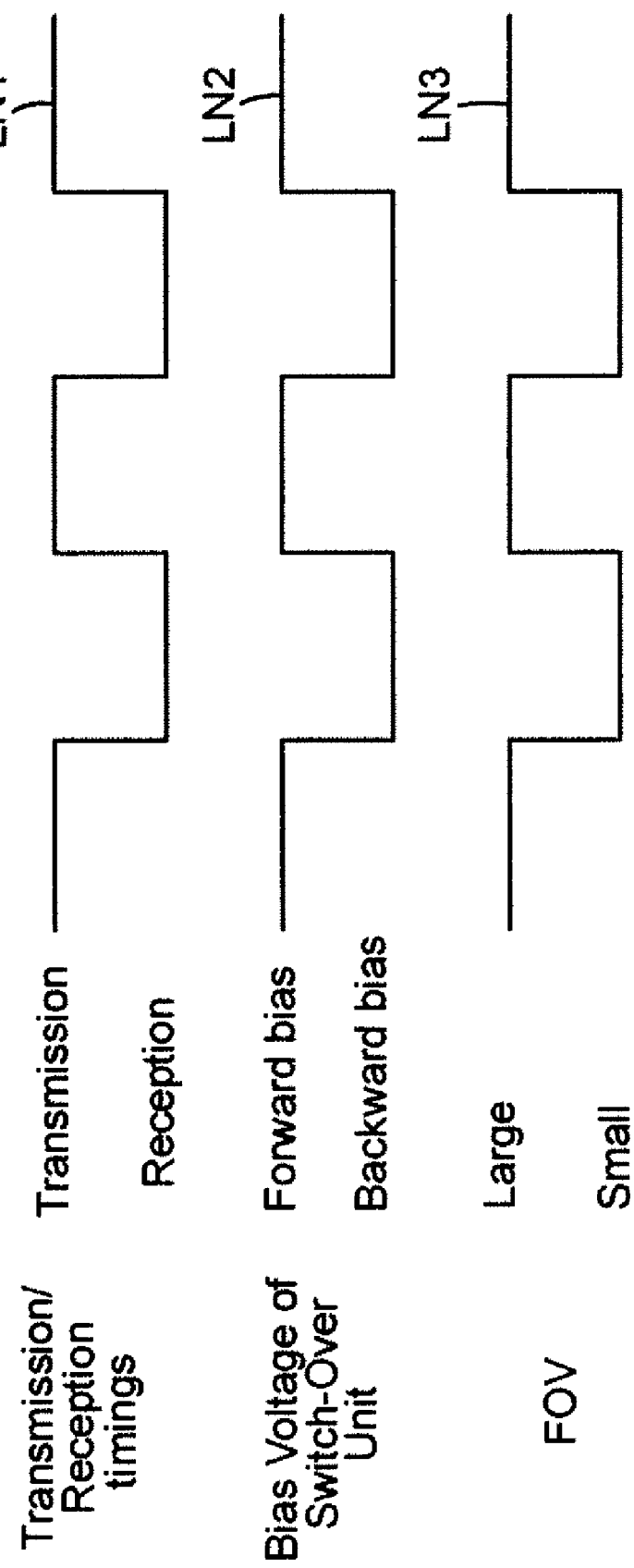
FIG. 3 is a time chart showing the methods of transmission and reception by the RF coil of FIG. 2.

FIG. 3 is a time chart showing the method of control of the switch-over unit 54 by the control unit 26. In FIG. 3, the horizontal axis is the time.

As indicated by solid line LN1, transmission and reception by the RF coil 15 are performed alternately at regular intervals of time. During transmission, the TR switch 65 makes the split loop unit 52A and the RF drive unit 22 conductive and makes the split loop unit 52A and the data collecting unit 24 non-conductive. The TR switch 66 makes the split loop unit 52B and the data collecting unit 24 non-conductive. And as indicated by solid line LN2, a bias voltage in the forward direction is applied to the diode 57 of the switch-over unit 54 to place the conductor 53 in a non-conductive state. Therefore, transmission is performed by the original loop unit 51 and, as indicated by solid line LN3, FOV is set large.

On the other hand, during reception, the TR switch 65 makes split loop unit 52A and the RF drive unit 22 non-conductive and makes the split loop unit 52A and the data collecting unit 24 conductive. The TR switch 66 makes the split loop unit 52B and the data collecting unit 24 conductive. And as indicated by solid line LN2, a bias voltage in the backward direction is applied to the diode 57 of the switch-over unit 54 to place the conductor 53 in a conductive state.

Therefore, reception is performed by each of the split loop units 52A and 52B and, as indicated by solid line LN3, FOV is set small.

Incidentally, the data processing unit 31 generates an image based on signals received by the split loop units 52A and 52B by, for instance, the sum-of-squares method, the SENSE method, the SMASH method or otherwise. When the SENSE method or the SMASH method is used, an image is generated by utilizing the difference in sensitivity distribution between the split loop units 52A and 52B. Thus, a folded image part is separated from the reconstructed image of the split loop units 52A and 52B and computed to generate a new tomogram of a large imaging area. By the SMASH method, data are processed before the Fourier transform of k spaces, while by the SENSE method image data after the Fourier transform are processed.

In the mode for implementation described so far, since a high frequency magnetic field is applied by the original loop unit 51 and reception is performed by the split loop units 52A and 52B, reception can be accomplished by a plurality of coils while uniformly exciting magnetic resonance signals.

As the sensitivity and other factors of an RF coil are generally influenced by the subject, the sensitivity and other factors of the RF coil vary with the positional relationship between the subject and the RF coil. Therefore, when transmission and reception are to be performed with an RF coil having a plurality of loop units, uneven transmission may occur depending on the positional relationship between the subject and the RF coil. However, as the head of the subject is symmetric in the right-and-left directions, unevenness in transmission in the right-and-left directions of the subject can be restrained by arranging the head of the subject at the center of the RF coil 80 by using a tool to position the head of the subject, such as a head rest.

On the other hand, since the head of the subject differs in shape between the face and the back part, it is asymmetric with respect to the central axis (prescribed axis) as viewed sideways (in a prescribed direction orthogonal to a prescribed axis). Therefore, it is difficult to restrain unevenness in transmission in the back-and-forth direction of the head of the subject by adjusting the position of arrangement of the head of the subject. However, by opposing the original loop unit 51 to a side of the head and transmitting with an original loop unit 81 of a relatively wide FOV and receiving with split loop units 82A and 82B of a relatively narrow FOV, it is possible to perform reception with a plurality of loop units while restraining transmission unevenness due to the asymmetry of the head of the subject in the back-and-forth direction. Incidentally, the arranging direction of the split loop units 82A and 82B in this case (the right-and-left directions of the surface of FIG. 2) is aligned with the back-and-forth direction of the head.

Additional Exemplary Mode for Implementation

In a second mode for implementation, having a similar configuration to the first mode for implementation, similar transmission and reception are performed. The configuration of the RF coil differs from the first mode for implementation, though. Incidentally, in the following account, the same constituent elements in the first mode for implementation will be denoted by respectively the same reference signs as in the first mode for implementation, and their description will be dispensed with.

Figure 4:
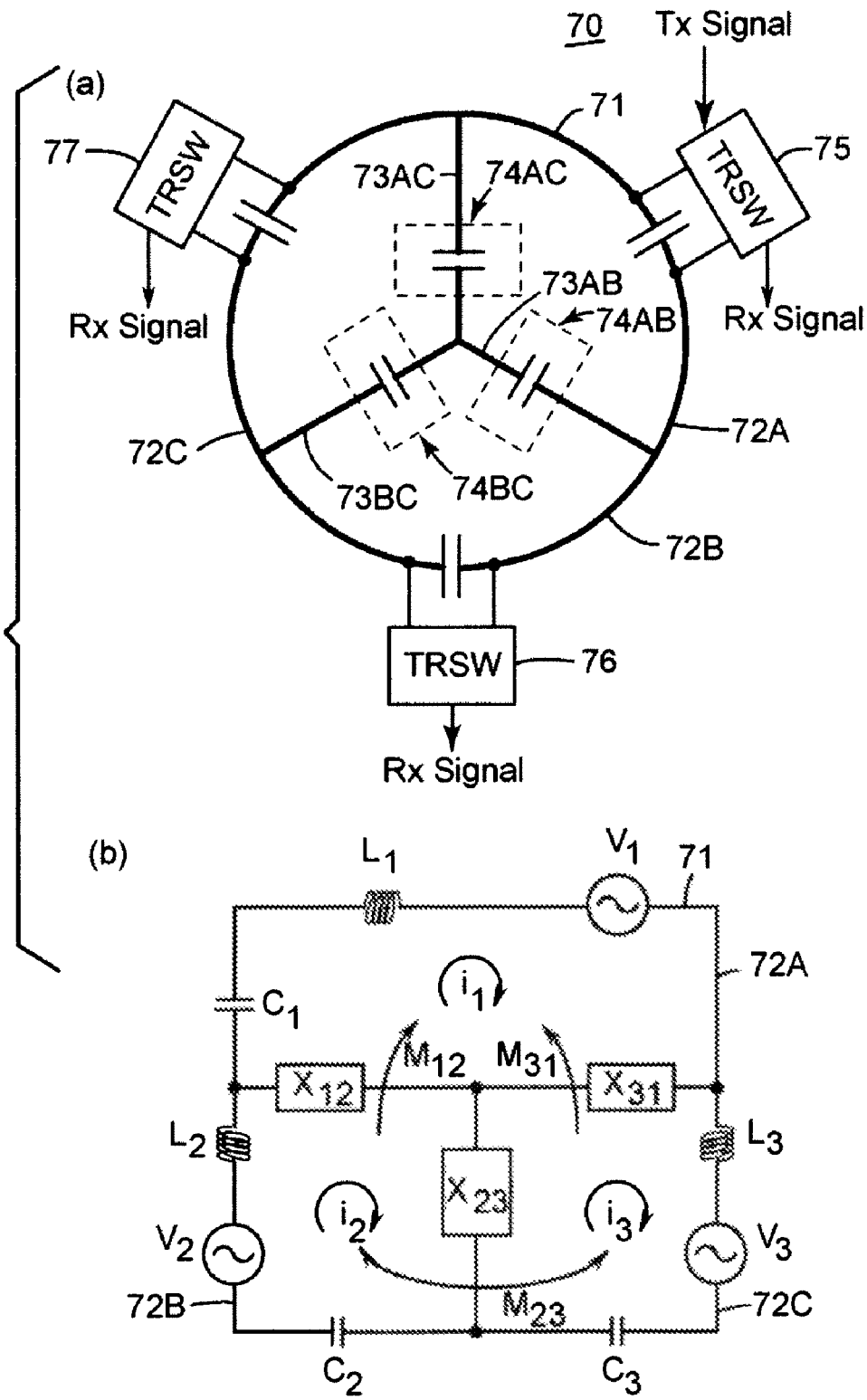
FIG. 4 are partially abridged circuit diagrams showing the configuration of the RF coil in the second mode for carrying out the invention.

FIG. 4(a) is a circuit diagram showing an RF coil 70 in the second mode for implementation with partial omissions. The RF coil 70 is provided with an original loop unit 71 and splits of the RF coil 70 divided into split loop units 72A, 72B and 72C.

The original loop unit 71 is formed containing a substantially circular shaped element, and a capacitor and an inductor are appropriately connected in series to it so as to configure a resonance circuit whose resonance frequency is a prescribed operation frequency.

The split loop units 72A, 72B and 72C are formed by the connection of conductors 73AB, 73BC and 73CA to the original loop unit 51 and the splitting of the original loop unit 71, and each contains part of the element of the original loop unit and two out of the conductors 73AB, 73BC and 73CA.

The conductors 73AB, 73BC and 73CA formed of the same material and in the same sectional shape as, for instance, the element of the original loop unit 71. Further, the conductors 73AB, 73BC and 73CA are formed, for instance, in a linear shape extending from the circumference side of the original loop unit 71 toward the center, and the split loop units 72A, 72B and 72C are formed in sector shapes equal in center angle. The conductors 73AB, 73BC and 73CA provided with capacitors or inductors as required so as to cause the split loop units 72A, 72B and 72C to configure a resonance circuit whose resonance frequency is a prescribed operation frequency.

Switch-over unit 74A, 74B and 74C have a similar configuration to the switch-over unit 54 in the first mode for implementation. A TR switch 75 has a similar configuration to the TR switch 65 in the first mode for implementation, and TR switches 76 and 77 have a similar configuration to the TR switch 66 in the first mode for implementation.

Also in the RF coil 70, as in the first mode for implementation, the static capacitances on the conductors 73AB, 73BC and 73CA are so set as to achieve isolation among the split loop units 72A, 72B and 72C. A more specific description follows.

FIG. 4(b) is a circuit diagram showing an equivalent circuit to the RF coil 70. Capacitors C1, C2 and C3 and inductors L1, L2 and L3 respectively represent capacitors and inductors equivalent to the capacitors and inductors on the element of the original loop unit 71 contained in the split loop units 72A, 72B and 72C, and $X_{12}$, $X_{23}$ and $X_{31}$ represent all the equivalent elements having impedances on the conductors 73AB, 73BC and 73CA. The mutual inductances of the split loop units 72A, 72B and 72C are supposed to be $M_{12}$, $M_{23}$ and $M_{31}$. Here, supposing that voltages $V_1$, $V_2$ and $V_3$ are applied and currents $i_1$, $i_2$ and $i_3$ flow to the split loop units 72A, 72B and 72C, respectively, the following equations will hold.

$$V_1 = X_{C1}i_1 + X_{L1}i_1 + X_{12}i_1 + X_{31}i_1 - X_{12}i_2 - X_{M12}i_2 - X_{31}i_3 - X_{M31}i_3$$

$$V_2 = X_{c2}i_2 + X_{L2}i_2 + X_{12}i_2 + X_{23}i_2 - X_{12}i_1 - X_{M12}i_1 - X_{23}i_3 - X_{M23}i_3$$

$$V_3 = X_{c3}i_3 + X_{L3}i_3 + X_{23}i_3 + X_{31}i_3 - X_{23}i_2 - X_{M23}i_2 - X_{31}i_1 - X_{M31}i_1$$

where $X_{c1}$, $X_{c2}$ and $X_{c3}$, $X_{L1}$, $X_{L2}$ and $X_{L3}$, $X_{12}$, $X_{23}$ and $X_{31}$, and $X_{M12}$, $X_{M23}$ and $X_{M31}$ are the respective impedances of the capacitors C1, C2 and C3, the inductors L1, L2 and L3, the elements $X_{12}$, $X_{23}$ and $X_{31}$, and the mutual inductances $M_{12}$, $M_{23}$ and $M_{31}$.

To rearrange the foregoing equations:

$$V_1 = (X_{c1} + X_{L1} + X_{12} + X_{31})i_1 - (X_{12} + X_{M12})i_2 - (X_{31} + X_{M31})i_3$$

$$V_2 = (X_{c2} + X_{L2} + X_{12} + X_{23})i_2 - (X_{12} + X_{M12})i_1 - (X_{23} + X_{M23})i_3$$

$$V_3 = (X_{c3} + X_{L3} + X_{23} + X_{31})i_3 - (X_{23} + X_{M23})i_2 - (X_{31} + X_{M31})i_1$$

If the split loop units 52A and 52B are isolated from each other, in other words if they are mutually unaffected by the other's current, the term of crosstalk will be 0, and therefore:

$$-(X_{12} + X_{M12})i_2 - (X_{31} + X_{M31})i_3 = 0$$

$$-(X_{12} + X_{M12})i_1 - (X_{23} + X_{M23})i_3 = 0$$

$$-(X_{23} + X_{M23})i_2 - (X_{31} + X_{M31})i_1 = 0$$

or where the term of crosstalk is 0 irrespective of $i_1$, $i_2$ and $i_3$:

$$X_{12} + X_{M12} = 0$$

$$X_{23} + X_{M23} = 0$$

$$X_{31} + X_{M31} = 0$$

Therefore, as in the first mode for implementation, $X_{12}$, $X_{23}$ and $X_{31}$ are static capacitances, $$\therefore X_{12} = 1/(\omega^2 M_{12}), X_{23} = 1/(\omega^2 M_{23}), X_{31} = 1/(\omega^2 M_{31})$$

Incidentally, $\omega$ is the operation frequency of the RF coil 70.

In the second mode for implementation described so far, a similar effect to the first mode for implementation can be achieved by performing transmission with the original loop unit 71 and reception with the split loop units 72A, 72B and 72C.

The present invention is not limited to the modes for implementation described above, but can be implemented in various other modes.

The RF coil may be any appropriate coil having a loop unit for performing transmission and reception, but is not limited to a surface coil, a phased array coil or a head coil. For instance, it may as well be a body coil or a coil dedicated to imaging of a specific region. The number of splits of the original loop unit can be set appropriately, but not limited to two or three. The method of achieving isolation between split coils is not limited to the setting of static capacitances. For instance, a neutralization circuit spanning the split coil may be provided.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
   a magnetostatic field forming unit which forms a magnetostatic field;
   a gradient magnetic field forming unit which forms a gradient magnetic field;
   an RF coil which applies a high frequency magnetic field to a subject within said magnetostatic field and receives magnetic resonance signals from said subject;
   an RF drive unit which outputs drive signals for applying said high frequency magnetic field to said RF coil;
   a data collecting unit which collects data based on the magnetic resonance signals received by said RF coil;
   an image forming unit which forms tomographic images of the subject on the basis of the data collected by said data collecting unit; and
   a control unit which controls the operation of said RF coil, wherein:
   said RF coil includes:
   an original loop unit;

a conductor which is so connected to said original loop unit as to split said original loop unit into a plurality of split loop units;

a capacitor located along the conductor, a switching unit having a pair of input/output conductors and each being connected to opposing terminals of the capacitor which makes said conductor either conductive or non-conductive thereby switching between the original loop unit and the split loop units, and said control unit so controls the operation of said switching means as to apply said high frequency magnetic field by way of said original loop unit and receive said magnetic resonance signals generated by the application by way of said split loop units.

2. The magnetic resonance imaging apparatus according to claim 1, wherein:

said RF drive unit is connected to any one of said plurality of split loop units, and said data collecting unit is connected to each of said plurality of split loop units.

3. The magnetic resonance imaging apparatus according to claim 2, further comprising:

a first switch which selectively makes conductive one split loop unit out of said plurality of split loop units and either one of said RF drive unit and said data collecting unit; and a second switch which makes conductive or non-conductive another split loop unit out of said plurality of split loop units and said data collecting unit, wherein:

said control unit so controls said first switch and said second switch as to make conductive said one split loop unit and said RF drive unit and make non-conductive said other split loop unit and said data collecting unit when said high frequency magnetic field is applied, or make conductive said one split loop unit and said data collecting unit and make conductive said other split loop unit and said data collecting unit when said magnetic resonance signals are received.

4. The magnetic resonance imaging apparatus according to claim 1 wherein:

said original loop unit is so arranged, as viewed in a presented direction orthogonal to a prescribed axis of said subject, as to be opposite to a prescribed region of said subject, which is asymmetric with respect to said presented axis, in said prescribed direction.

5. The magnetic resonance imaging apparatus according to claim 1, wherein:

said conductor is provided with an electrostatic capacitance element connected in series; and the electrostatic capacitance of said electrostatic capacitance element is so set as not to allow said plurality of split loop units to interfere with each other when said conductor is made conductive by said switching means.

6. The magnetic resonance imaging apparatus according to claim 1, wherein:

said switching unit is configured of a parallel oscillation circuit, the parallel oscillation circuit comprising:

a switching electrostatic capacitance element connected in series to said conductor an inductance element connected in parallel to said switching electrostatic capacitance element; and a diode connected in series to said inductance element.

7. The magnetic resonance imaging apparatus according to claim 1, wherein:

said image forming unit generates by the SENSE method an image based on the magnetic resonance signals received by said plurality of split loop units.

8. An RF coil of a magnetic resonance imaging apparatus comprising:

a singular original loop unit employed for transmission and reception;

a conductor which is so connected to said original loop unit as to split said original loop unit into a plurality of split loop units;

a capacitor located along the conductor, and a switching unit having a pair of input/output conductors and each being connected to opposing terminals of the capacitor, the switching unit switching the state of said RF coil between a transmitting state via the original loop unit in which said conductor is made non-conductive and a resonance circuit whose resonance frequency is a prescribed operation frequency is formed of said original loop unit and a receiving state via the split loop units in which said conductor is made conductive and a resonance circuit whose resonance frequency is said operation frequency is formed of said plurality of split loop units.

9. An RF coil of a magnetic resonance imaging apparatus comprising:

an original loop unit an electrostatic capacitance element electrically connected with the loop unit;

a switching unit having a pair of input/output conductors and each being connected to opposing terminals of the electrostatic capacitance element; and a conductor, interconnected with the electrostatic capacitance element and, which is so connected to opposing sides of electrostatic capacitive element to split said original loop unit into a plurality of split loop units, wherein:

original loop unit is connected to an RF drive unit when the conductor is not conductive, and each of said plurality of split loop units is connected to a data collecting unit which collects data based on received magnetic resonance signals when the conductor is conductive.

10. An RF coil of a magnetic resonance imaging apparatus comprising:

an original loop unit;

a conductor which is so connected to said original loop unit as to split said original loop unit into a plurality of split loop units;

an electrostatic capacitance element connected in series to said conductor; and a switching unit having a pair of input/output conductors each connected to opposing terminals of the electrostatic capacitance element which makes said conductor either conductive or non-conductive, and which makes said conductor conductive to split the original loop unit into the plurality of split loop units for receiving or non-conductive where the original loop unit is used for transmitting, wherein:

the electrostatic capacitance of said electrostatic capacitance element is so set as not to allow said plurality of split loop units to interfere with each other when said conductor is made conductive by said switching unit; and each of said plurality of split loop units is connected to a data collecting unit which collects data based on received magnetic resonance signals.

* * * * *